(12) United States Patent
Montalvo et al.

(10) Patent No.: US 8,120,428 B2
(45) Date of Patent: Feb. 21, 2012

(54) APPARATUS AND METHOD FOR LOW NOISE AMPLIFICATION

(75) Inventors: Antonio Montalvo, Raleigh, NC (US); David McLaurin, Durham, NC (US); Carl Grace, Pleasant Hill, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/782,237

(22) Filed: May 18, 2010

(65) Prior Publication Data

US 2011/0285464 A1 Nov. 24, 2011

(51) Int. Cl.
*H03F 3/68* (2006.01)

(52) U.S. Cl. ........................................ 330/311; 330/293

(58) Field of Classification Search .......... 330/310–311, 330/293, 282, 277–278, 296; 375/316
See application file for complete search history.

(56) References Cited

U.S. PATENT DOCUMENTS

| | | | |
|---|---|---|---|
| 5,557,642 A | 9/1996 | Williams | |
| 5,574,405 A | 11/1996 | Razavi | |
| 6,026,286 A | 2/2000 | Long | |
| 6,275,687 B1 | 8/2001 | Lloyd | |
| 6,298,226 B1 | 10/2001 | Lloyd et al. | |
| 6,392,492 B1 | 5/2002 | Yuan | |
| 6,628,170 B2 | 9/2003 | Titus | |
| 6,631,170 B1 | 10/2003 | Gu | |
| 7,495,515 B1 * | 2/2009 | Branch et al. | 330/305 |
| 2003/0017809 A1 | 1/2003 | Garlepp et al. | |
| 2006/0038710 A1 | 2/2006 | Staszewski et al. | |
| 2007/0155429 A1 | 7/2007 | Levy et al. | |
| 2008/0231362 A1 * | 9/2008 | Muthali et al. | 330/253 |
| 2010/0291881 A1 * | 11/2010 | Brunn et al. | 455/73 |

* cited by examiner

*Primary Examiner* — Hieu Nguyen
(74) *Attorney, Agent, or Firm* — Knobbe Martens Olson & Bear LLP

(57) ABSTRACT

Apparatus and methods are disclosed, such as those involving a low noise amplifier. One such apparatus includes a low noise amplifier circuit configured to receive a signal at an input node and to output an amplified signal at an output node. The low noise amplifier circuit includes a first transistor of a first polarity; and a second transistor of a second polarity complementary to the first polarity. The first and second transistors are connected in series between first and second supply voltage nodes via the output node. The circuit further includes a third transistor cascoded with one of the first transistor or the second transistor, but does not include a transistor cascoded with the other transistor. This configuration allows the low noise amplifier circuit to provide an increased high-frequency gain and linearity while having improved high-frequency system noise figure in, for example, deep submicron CMOS technology.

35 Claims, 8 Drawing Sheets

APPARATUS AND METHOD FOR LOW NOISE AMPLIFICATION

BACKGROUND

1. Field

Embodiments of the invention relate to electronic devices, and more particularly, in one or more embodiments, to low noise amplifiers.

2. Description of the Related Technology

Recently, many electronic systems have employed wireless capability. Such electronic systems can include a wireless receiver that processes a wireless signal (for example, a radio frequency signal) received via a wireless medium, such as air. A wireless receiver can include various components to amplify and/or filter a wireless signal to recover original data carried by the wireless signal.

Among the various components of a wireless receiver, a low noise amplifier can serve to amplify a relatively weak incoming wireless signal with a gain such that the wireless signal can be processed at subsequent stages of the wireless receiver. The low noise amplifier can also serve to reduce the effect of noise from the subsequent stages. The low noise amplifier can be implemented using various technologies, for example, complementary metal oxide semiconductor (CMOS) technology.

SUMMARY

In one embodiment, an apparatus includes an amplifier circuit comprising: an input node; an output node; a first supply voltage node configured to be electrically coupled to a first voltage source; a second supply voltage node configured to be electrically coupled to a second voltage source; a first transistor of a first polarity; and a second transistor of a second polarity complementary to the first polarity. The first and second transistors are connected in series between the first and second supply voltage nodes via the output node. The amplifier circuit also includes a third transistor cascoded with one of the first transistor or the second transistors, wherein the third transistor is electrically coupled and inserted between the one of the first transistor or the second transistor and the output node. The amplifier circuit does not include a transistor cascoded with the other of the first transistor or the second transistor.

In another embodiment, an electronic device comprises: a low noise amplifier circuit configured to receive a signal at an input node and to output an amplified signal at an output node. The low noise amplifier circuit comprises: a first transistor of a first polarity; a second transistor of a second polarity complementary to the first polarity, wherein the first and second transistors are connected in series between first and second supply voltage nodes via the output node; and a third transistor cascoded with one of the first transistor or the second transistor, wherein the third transistor is electrically coupled between the one of the first transistor or the second transistor and the output node. The low noise amplifier circuit does not include a transistor cascoded with the other of the first transistor or the second transistor.

In yet another embodiment, a method of amplifying a signal is provided. The method comprises: providing a signal to one or more of a first transistor of a first polarity, and a second transistor of a second polarity complementary to the first polarity. The first and second transistors are connected in series between first and second supply voltages. One of the first transistor or the second transistor is cascoded with a third transistor electrically coupled between the first and second transistors. The other of the first transistor or the second transistor is not cascoded with a transistor. The method also includes outputting an amplified signal via an output node between the third transistor and the other of the first transistor or the second transistor.

DETAILED DESCRIPTION OF EMBODIMENTS

Figure 1:
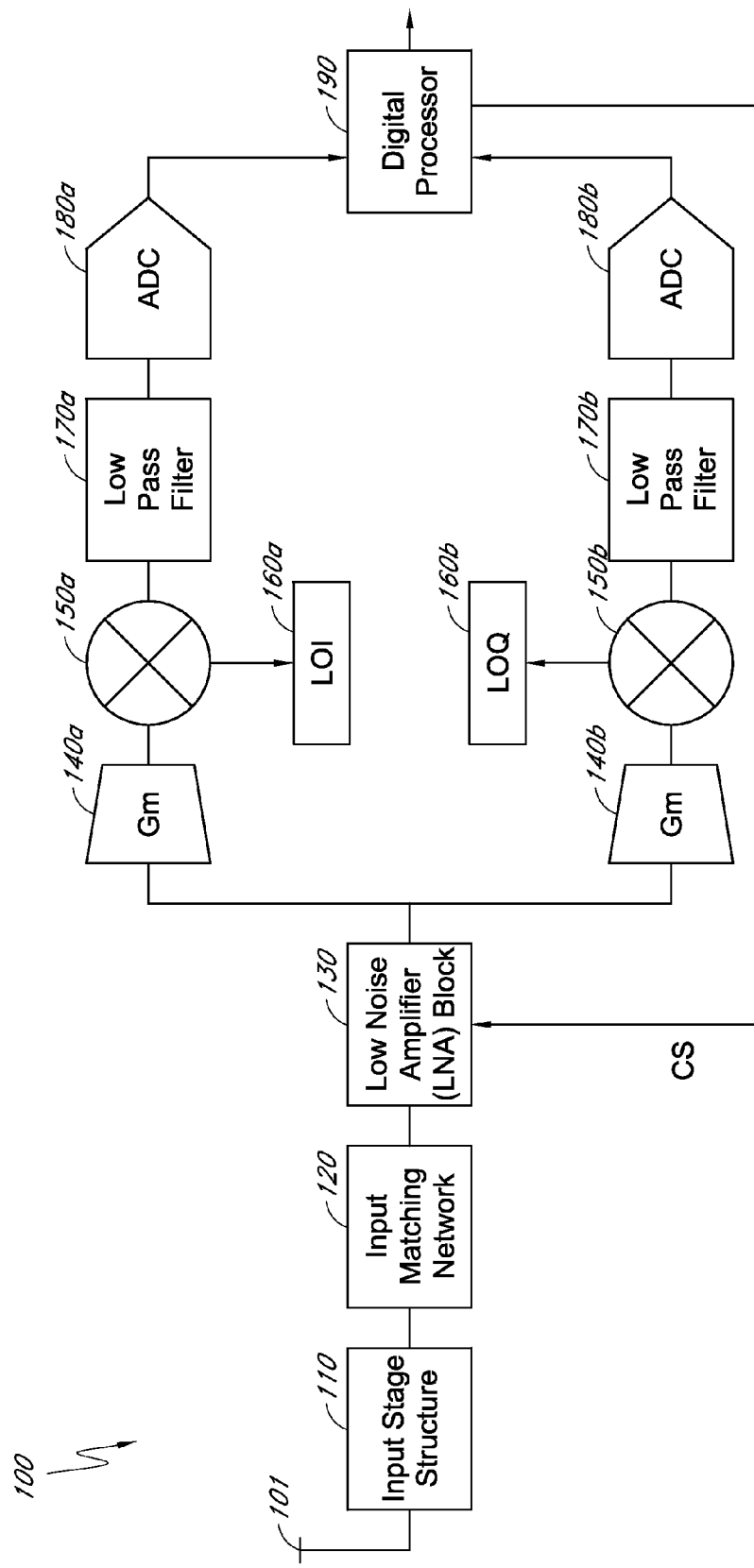
FIG. 1 is a schematic block diagram illustrating a wireless receiver including a low noise amplifier according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Wireless Receiver

Referring to FIG. 1, a wireless receiver system for receiving and processing wireless signals according to one embodiment will be described below. The illustrated system 100 includes an antenna 101, an input stage structure 110, an input matching network 120, a low noise amplifier block 130, a first transconductor 140a, a second transconductor 140b, a first mixer 150a, a second mixer 150b, a first local oscillator 160a, a second local oscillator 160b, a first low pass filter 170a, a second low pass filter 170b, a first analog-to-digital converter 180a, a second analog-to-digital converter 180b, and a digital processor 190.

The antenna 101 is configured to receive a wireless signal transmitted via a wireless medium, such as air. The antenna 101 can be any suitable antenna for wireless signal reception. The antenna 101 provides the received wireless signal to the input stage structure 110.

The input stage structure 110 serves to receive the wireless signal from the antenna 101 and process the wireless signal. The input stage structure 110 can include, for example, an antenna interface circuit to interface with the antenna 101, and a filter (for example, a band pass filter) to filter signals outside a signal band of interest. The input stage structure 110 provides the processed signal to the input matching network 120.

The input matching network 120 serves to improve power transfer from the input stage structure 110 to the low noise amplifier block 130 and to reduce signal reflection by the low noise amplifier block 130. Further, the input matching network 120 can serve to improve the noise performance of the low noise amplifier block 130. The input matching network 120 can be a passive network configured to match the impedance of the low noise amplifier block 130 with the impedance of the structure (for example, the input stage structure 110 and the antenna 101) on the opposite side of the input matching network 120 from the low noise amplifier block 130. The input matching network 120 receives the processed signal from the input stage structure 110, and provides it to the low noise amplifier block 130.

The low noise amplifier block 130 serves to amplify the signal from the input matching network 120, and provides the amplified signal to the first and second transconductors 140a, 140b. The low noise amplifier block 130 is configured to amplify a relatively weak signal with a gain such the effect of noise on subsequent stages of the receiver system 100 is reduced. It is desirable that the low noise amplifier block 130 boosts the signal power while adding as little noise and distortion as possible.

In the illustrated embodiment, the low noise amplifier block 130 can include a half cascode circuit and a bias circuit. The half cascode circuit serves to amplify the incoming signal. Details of the half cascode circuit will be described in connection with FIGS. 4-6B. The bias circuit serves to provide a bias voltage to the half cascode circuit. Details of the bias circuit will be described in connection with FIG. 8.

Each of the first and second transconductors 140a, 140b serves to convert the amplified signal in voltage form into a current signal. The first and second transconductors 140a, 140b provide the current signals to the first and second mixers 150a, 150b.

The first mixer 150a serves to receive the current signal from the first transconductor 140a and a first local frequency signal from the first local oscillator 160a, and to generate a first mixed signal. The first mixed signal can include the fundamental frequencies of the current signal, the first local frequency signal, harmonics thereof, and intermodulation products.

The second mixer 150b serves to receive the current signal from the second transconductor 140b and a second local frequency signal from the second local oscillator 160b, and to generate a second mixed signal. The second mixed signal can include the fundamental frequencies of the current signal, the second local frequency signal, harmonics thereof, and intermodulation products.

In the illustrated embodiment where quadrature amplitude modulation (QAM) technique is used, the first local frequency signal can be used to process in-phase (I) components of the received wireless signal while the second local frequency signal can be used to process quadrature (Q) components of the received wireless signal. The first and second local frequency signals can have a phase difference of about 90 degrees from each other.

The first and second low pass filters 170a, 170b serve to filter the first and second mixed signals, respectively, and provide the filtered signals to the first and second analog-to-digital converters 180a, 180b, respectively. The first and second low pass filters 170a, 170b can select a desired intermediate frequency (IF) and block undesired frequencies. In another embodiment, the first and second low pass filters 170a, 170b can be replaced with band pass filters.

The first and second analog-to-digital converters 180a, 180b serve to convert the filtered signals in analog form into digital signals. The first and second analog-to-digital converters 180a, 180b can provide the digital signals to the digital processor 190.

The digital processor 190 serves to receive the digital signals from the first and second analog-to-digital converters 180a, 180b, and perform digital signal processing on the digital signals. The digital signal processing can include, for example, demultiplexing and decoding. In the illustrated embodiment, the digital processor 190 can also provide a control signal CS to the low noise amplifier block 130 to control the operation of the low noise amplifier block 130, as will be described in detail in connection with FIG. 8.

In the illustrated embodiment, the low noise amplifier block 130, and the components downstream of the low noise amplifier block 130 on the receive path can be configured to provide either a single-ended signaling scheme or a differential signaling scheme. In an embodiment where a differential signaling scheme is employed, the low noise amplifier block 130 can include a first low noise amplifier and a second low noise amplifier. In such an embodiment, the first low noise amplifier can be driven with a non-inverted input signal, and the second low noise amplifier can be driven with an inverted input signal, thereby forming one differential low noise amplifier. In another embodiment, the low noise amplifier block 130 can include two single-ended low noise amplifiers, each of which forms part of a single-ended signaling path. In these embodiments, each of the low noise amplifiers can have any one of configurations in the embodiments which will be described below in connection with FIGS. 4-7.

Low Noise Amplifier Having Cascoded Transistors

As described above in connection with FIG. 1, a low noise amplifier can be implemented with an input matching network (for example, the input matching network 120 of FIG. 1). The input matching network serves to match the impedance of the low noise amplifier with the impedance of a source (for example, the antenna 101 and the input stage structure 110 of FIG. 1). The network can also be used to improve the noise performance of the amplifier.

Figure 2:
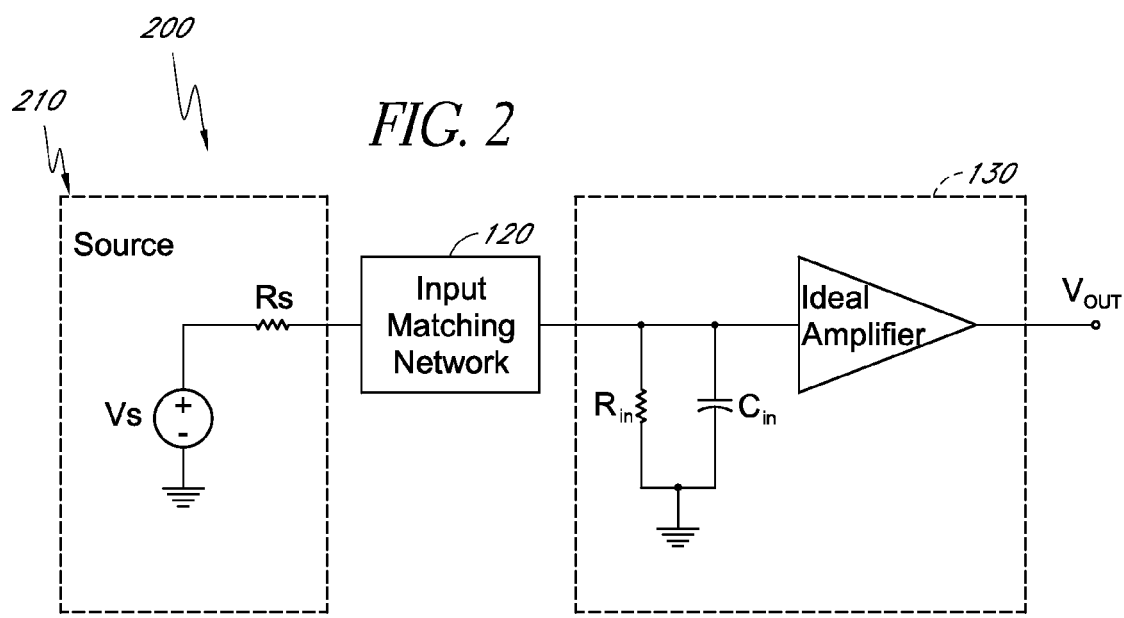
FIG. 2 is a schematic block diagram illustrating an equivalent circuit of a portion of the receive path of a wireless receiver.

FIG. 2 is a circuit diagram of a Thevenin equivalent circuit 200 including a source 210, an input matching network 120, and a low noise amplifier 130. The source 210 provides a signal to the low noise amplifier 130 via the input matching network 120. The source 210 is modeled as a Thevenin equivalent circuit having a voltage source Vs and a source resistance (or impedance) Rs that are connected in series. The anode of the voltage source Vs is electrically coupled to one end of the source resistance Rs, and the cathode of the voltage source Vs is electrically coupled to ground. The other end of the source resistance Rs is electrically coupled to the input matching network 120. The illustrated source 210 can be a Thevenin equivalent circuit of the antenna 101 and the input stage structure 110 of FIG. 1.

The low noise amplifier 130 is modeled as an ideal amplifier AMP with gain A, an equivalent input resistance $R_{in}$, and an equivalent input capacitance $C_{in}$. One end of the input resistance $R_{in}$ is electrically coupled to the input of the ideal amplifier AMP, and the other end of the input resistance $R_{in}$ is electrically coupled to ground. A first terminal of the input capacitance $C_{in}$, is electrically coupled to the input of the ideal amplifier AMP, and a second terminal of the input capacitance $C_{in}$, is electrically coupled to ground. The ideal amplifier AMP is configured to receive a signal from the input matching network 120, and output an amplified signal $V_{OUT}$ at its output. For maximum power transfer (or minimum reflection by the low noise amplifier 130), the input matching network 120 is configured to transform the input resistance $R_{in}$ to match with the source resistance $R_s$.

Both the equivalent input resistance $R_{in}$ and the equivalent input capacitance $C_{in}$, of FIG. 2 contribute to the input impedance of the ideal amplifier AMP. The input impedance of the ideal amplifier AMP affects the Noise Figure (NF) of the ideal amplifier AMP. In the context of this document, the term "Noise Figure" refers to a measure of degradation of the signal-to-noise ratio (SNR), caused by components in a wireless signal (for example, radio frequency signal) chain. The Noise Figure can be defined as the ratio of the output noise power of a device to the portion thereof attributable to thermal noise in the input termination at standard noise temperature $T_0$ (usually 290 K). The Noise Figure is thus the ratio of actual output noise to that which would remain if the device itself did not introduce noise.

In certain applications, an increased input impedance of the ideal amplifier AMP can improve the Noise Figure of the ideal amplifier AMP. When the input resistance $R_{in}$, is larger than source resistance $R_s$, the input matching network 120 provides a voltage gain, which improves the combined Noise Figure (NF) of the input matching network 120 and the ideal amplifier AMP. The input capacitance $C_{in}$, however, can lower the input impedance of the ideal amplifier AMP, and therefore reduces the improvement in the Noise Figure. Therefore, reducing the input capacitance $C_{in}$, can make the technique of using increased input impedance to improve the Noise Figure more effective.

In addition to providing a low noise, a high gain in the low noise amplifier 130 is desirable in a wireless receiver so that the overall receiver noise performance is dominated by the low noise amplifier 130. In conventional complementary metal oxide semiconductor (CMOS) technology, the inherent output impedance of a single field effect transistor (FET) was sufficient to provide the self-gain needed to achieve an overall forward voltage gain of about 20 dB, which is typically required to meet overall system noise requirements.

In deep submicron CMOS technology (which is the primary technology for Ultra-Large Scale Integration (ULSI)), however, a single FET may not provide a sufficient gain. For example, in 65 nm CMOS, the self-gain of a single FET is less than 10, such that the maximum voltage gain available from a single FET is less than 20 dB, and in practice, the gain is typically less than the maximum gain.

To achieve a higher gain in a single stage than is available in a single FET, a cascode structure (or cascode circuit) can be used. In a cascode structure, multiple FETs are stacked to increase the overall output impedance.

Figure 3:
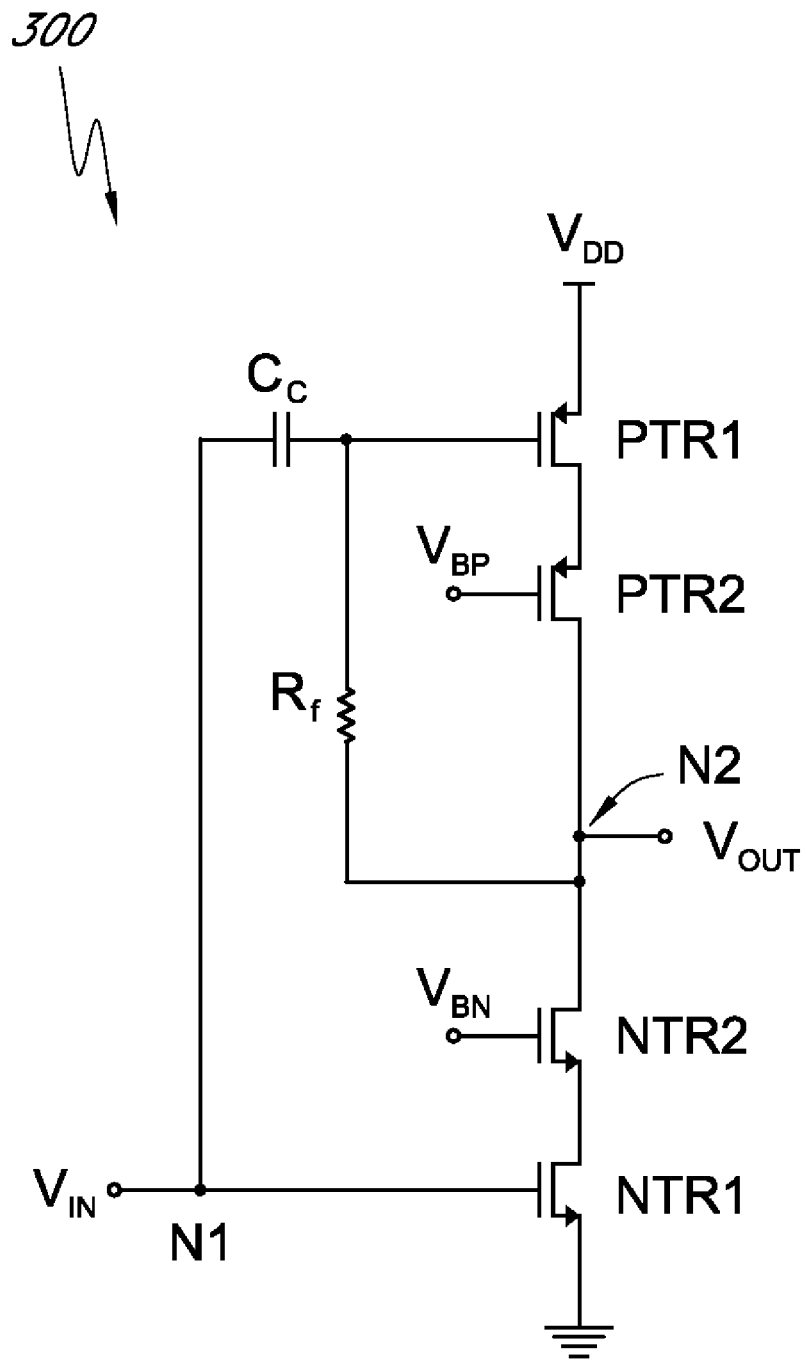
FIG. 3 is a circuit diagram of a conventional full cascode low noise amplifier.

An example of a conventional circuit having a cascode structure is shown in FIG. 3. The illustrated circuit 300 includes a first p-type transistor PTR1, a second p-type transistor PTR2, a first n-type transistor NTR1, a second n-type transistor NTR2, a feedback resistor $R_f$, a coupling capacitor $C_c$, a first node N1, and a second node N2. In the illustrated example, each of the transistors PTR1, PTR2, NTR1, NTR2 can be a metal oxide semiconductor (MOS) FET device. In the context of this document, the circuit 300 formed by the transistors PTR1, PTR2, NTR1, NTR2 can be referred to as a "full cascode structure," "full cascode circuit," or "NMOS and PMOS cascode circuit."

Referring to FIG. 3, the first p-type transistor PTR1 has a source electrically coupled to a first voltage source $V_{DD}$, a drain electrically coupled to the source of the second p-type transistor PTR2, and a gate electrically coupled to a first terminal of the coupling capacitor $C_c$. The second p-type transistor PTR2 has a source electrically coupled to the drain of the first p-type transistor PTR1, a drain electrically coupled to the second node N2, and a gate electrically coupled to a first bias voltage $V_{BP}$.

The first n-type transistor NTR1 has a source electrically coupled to ground, a drain electrically coupled to the source of the second n-type transistor NTR2, and a gate electrically coupled to the first node N1. The second n-type transistor NTR2 has a source electrically coupled to the drain of the first n-type transistor NTR1, a drain electrically coupled to the second node N2, and a gate electrically coupled to a second bias voltage $V_{BN}$.

The coupling capacitor $C_c$ has a first terminal electrically coupled to the gate of the first p-type transistor PTR1, and a second terminal electrically coupled to the first node N1. The feedback resistor $R_f$ has a first end electrically coupled to the first terminal of the coupling capacitor $C_c$, and a second end electrically coupled to the second node N2. The first node N1 is configured to receive an input signal $V_{IN}$, and the second node N2 is configured to provide an output signal $V_{OUT}$.

The illustrated cascode structure of the circuit 300 also has the beneficial effect of reducing the impact of the Miller effect, thereby lowering the effective input capacitance $C_{in}$, (see $C_{in}$, of FIG. 2). As is well-known in the art, the Miller effect accounts for an increase in the equivalent input capacitance of an amplifier due to amplification of capacitance between the input and output terminals. When the amplifier includes a MOSFET device, the capacitance between the input and output terminals can be the gate-to-drain capacitance $C_{gd}$ of the MOSFET device.

The Miller effect can adversely affect high-frequency performance by lowering the magnitude of the input pole, thereby limiting the bandwidth. The Miller effect can also reduce the input impedance of the amplifier at high frequency, thereby reducing the voltage gain of the amplifier from input to output. Since the input noise of a low noise amplifier does not change, its Noise Figure is increased. This reduces the effectiveness of using an impedance transformation in the matching network to lower the Noise Figure. To mitigate these effects, cascoding can be used to reduce the signal swing across the gate-to-drain capacitance $C_{gd}$ of a MOSFET device in an amplifier while simultaneously increasing the high-frequency gain and input impedance.

Low Noise Amplifier with Low Supply Voltage

In deep submicron CMOS technology, however, the application of the conventional full cascode circuit can be problematic because supply voltages are lower than those of a conventional CMOS device. The lower supply voltages translate to less voltage headroom available to drop across the cascode structure.

For example, in 65 nm deep submicron CMOS technology, a power supply voltage of about 1.2 V is typically used. For example, the first voltage source $V_{DD}$ of FIG. 3 can have a voltage of about 1.2V. As shown in FIG. 3, the conventional cascode amplifier includes both PMOS and NMOS FET devices cascoded. In other words, the amplifier has four stacked FET devices between the voltage supply ($V_{DD}$) and ground.

With a FET device overdrive of about 0.2 V, the amplifier having four stacked FET devices needs an overdrive of about 0.8 V. This leaves only about 0.4 V available to avoid pushing the cascoded devices into their triode operating regions. Thus, only a 0.2 Vp-p signal would be possible to operate with the amplifier. Such a small signal swing increases the cost of achieving low noise simultaneously with sufficient linearity. Therefore, there is a need for a circuit for a low noise amplifier provided with a relatively low supply voltage provided in, for example, deep submicron CMOS technology.

In some embodiments, a low noise amplifier can include a CMOS transistor pair including a PMOS transistor and an NMOS transistor coupled between a first voltage source (having a voltage employed in, for example, circuits implemented by deep submicron CMOS technology) and a second voltage source (for example, ground). In the embodiments, only one of the PMOS transistor or the NMOS transistor is cascoded with another MOS transistor of the same type as that of the one transistor. In the context of this document, such a configuration can be referred to as a "half cascode structure" or "half cascode circuit." In some embodiments, only the PMOS transistor is cascoded with another PMOS transistor. In other embodiments, only the NMOS transistor is cascoded with another NMOS transistor.

The transistors used for cascoding either the PMOS or NMOS transistor can be biased by a bias circuit. In certain embodiments, the bias circuit can be controlled, using a feedback signal generated by a wireless receiver to which the low noise amplifier belongs. For example, a stage subsequent to the low noise amplifier can generate the feedback signal in response to a signal that has been processed by the low noise amplifier. The low noise amplifiers according to embodiments described herein can operate at a relatively low supply voltage of deep submicron CMOS technology while providing optimized gain and noise performance in, for example, high frequency applications.

Figure 4:
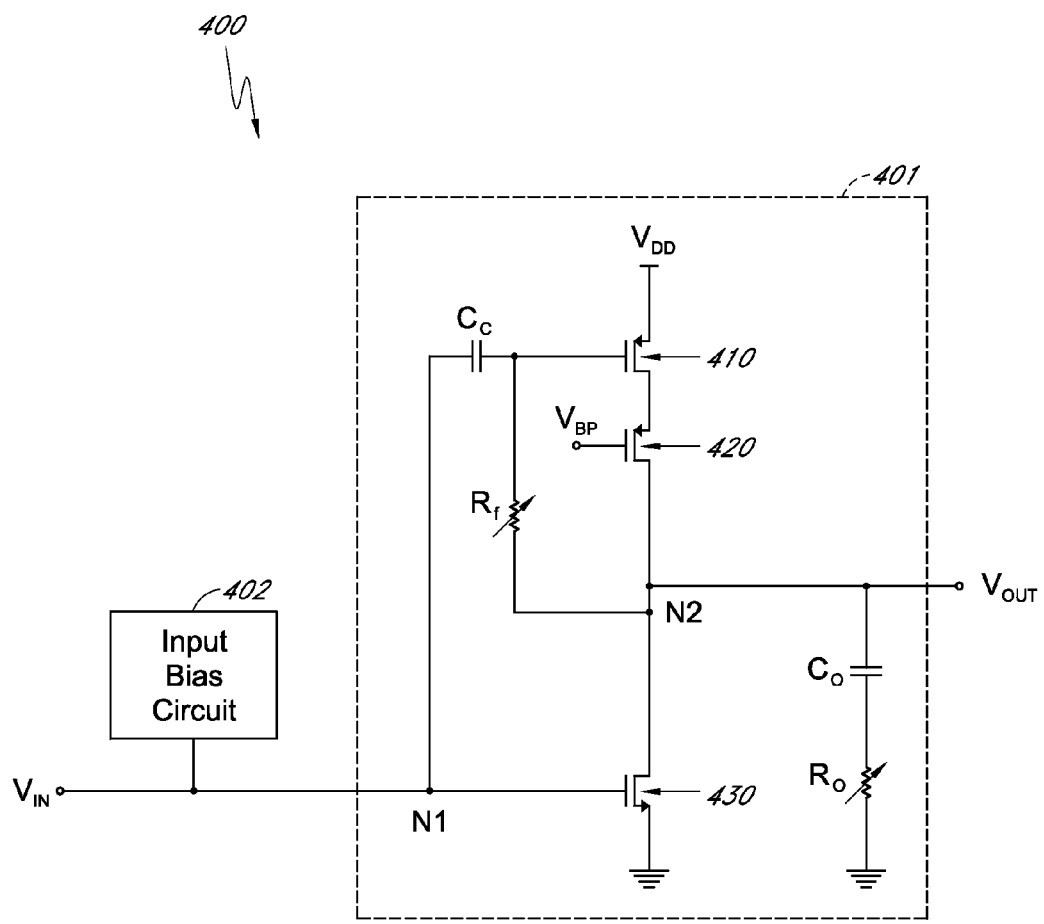
FIG. 4 is a circuit diagram of a low noise amplifier according to one embodiment.

Referring to FIG. 4, one embodiment of a low noise amplifier (for example, for use in the low noise amplifier block 130 of FIG. 1) will be described below. The illustrated low noise amplifier 400 includes an amplifier circuit 401 and an input bias circuit 402. The illustrated amplifier circuit 401 includes a first p-type transistor 410, a second p-type transistor 420, a first n-type transistor 430, a variable feedback resistor $R_f$, a coupling capacitor $C_c$, an output capacitor $C_O$, an output resistor $R_O$, a first node N1, and a second node N2. In certain embodiments, the output capacitor $C_O$ and/or the output resistor $R_O$ can be omitted.

The circuit 401 does not include a second n-type transistor in contrast to the circuit 300 of FIG. 3. In the illustrated embodiment, each of the transistors 410, 420, 430 can be a MOSFET device. In the context of this document, a circuit (such as the circuit 401) having a single n-type transistor, and a first p-type transistor cascoded with a second p-type transistor can be referred to as a "PMOS half-cascode circuit."

The first p-type transistor 410 has a source electrically coupled to a first voltage source $V_{DD}$, a drain electrically coupled to the source of the second p-type transistor 420, and a gate electrically coupled to a first terminal of the coupling capacitor Cc. The first voltage source $V_{DD}$ can have a voltage between about 1.1 V and about 1.3 V, for example, about 1.2 V.

The second p-type transistor 420 has a source electrically coupled to the drain of the first p-type transistor 410, a drain electrically coupled to the second node N2, and a gate electrically coupled to a first bias voltage $V_{BP}$. The first n-type transistor 430 has a source electrically coupled to ground, a drain electrically coupled to the second node N2, and a gate electrically coupled to the first node N1.

The coupling capacitor $C_c$ has a first terminal electrically coupled to the gate of the first p-type transistor 410, and a second terminal electrically coupled to the first node N1. The coupling capacitor $C_c$ can have a capacitance between about 3 pF and about 4 pF.

The feedback resistor $R_f$ has a first end electrically coupled to the first terminal of the coupling capacitor $C_c$, and a second end electrically coupled to the second node N2. The feedback resistor $R_f$ can have a variable resistance ranging between about 0 ohms and about 1,000 ohms. The first node N1 is configured to receive an input signal $V_{IN}$, and the second node N2 is configured to provide an output signal $V_{OUT}$.

The output capacitor $C_O$ has a first terminal electrically coupled to the second node N2, and a second terminal electrically coupled to the output resistor $R_O$. The output capacitor $C_O$ can have a capacitance between about 3 pF and about 4 pF.

The output resistor $R_O$ has a first end electrically coupled to the second terminal of the output capacitor $C_O$, and a second end electrically coupled to ground. The output resistor $R_O$ can have a variable resistance ranging between about 0 ohms and about 1,000 ohms. In one embodiment, the resistance of the output capacitor $C_O$ can be changed in concert with the resistance of the feedback resistor $R_f$ to vary the gain of the amplifier 400.

The input bias circuit 402 serves to bias a transistor which receives the input signal V. In the illustrated embodiment, the input bias circuit 402 provides a bias voltage to the gate of the first n-type transistor 430 via the first node N1. A skilled artisan will appreciate that various configurations of bias circuits can be used for the input bias circuit 402. In one embodiment, the input bias circuit 402 can include a current minor circuit and one or more resistors coupled between the output of the current mirror circuit and the first node N1. In other embodiments, the input bias circuit 402 may be controlled to provide different bias voltages, depending on the needs.

The first n-type transistor 430 and the first p-type transistor 410 are connected in a complementary configuration. During high frequency operation, however, the first p-type transistor 410 operates as if the source of the first p-type transistor 410 is connected to ground. The first p-type transistor 410 receives an input signal $V_{IN}$ through the coupling capacitor $C_c$ and amplifies the input signal $V_{IN}$ to generate the output signal $V_{OUT}$. The first n-type transistor 430 also receives the input signal $V_{IN}$ directly via the first node N1, and amplifies the input signal $V_{IN}$ to generate the output signal $V_{OUT}$. The output signal $V_{OUT}$ has feedback to the input signal $V_{IN}$ via the feedback resistor $R_f$. The feedback resistor $R_f$ provides shunt feedback to stabilize the operating point and set the input impedance of the circuit 400.

The first p-type transistor 410, by being cascoded with the second p-type transistor 420, has a reduced Miller effect, thereby reducing the input capacitance. Typically, the lower the carrier mobility of a FET device, the greater the gate-to-drain capacitance of the device. Because a p-type transistor has a lower carrier mobility than an n-type transistor, the p-type transistor has a larger gate-to-drain capacitance than that of an n-type transistor for a given transconductance. Further, the first p-type transistor 410, which is a PMOS device, has reduced output impedance compared to an NMOS device. Thus, by cascoding the p-type transistor 410, the overall forward gain can be maximized.

Further, only three MOS devices are connected between the voltage supply $V_{DD}$ and ground, instead of four MOS devices in the conventional amplifier of FIG. 3. With a FET device overdrive of about 0.2 V, the amplifier of FIG. 4 has an overdrive of about 0.6 V. Given a voltage supply $V_{DD}$ of about 1.2 V, this leaves about 0.6 V available to avoid pushing the cascoded devices into their triode operating regions. Thus, a 0.3 Vp-p signal would be possible to operate with the amplifier, providing better noise performance with sufficient linearity than the amplifier 300 of FIG. 3.

Figure 5A:
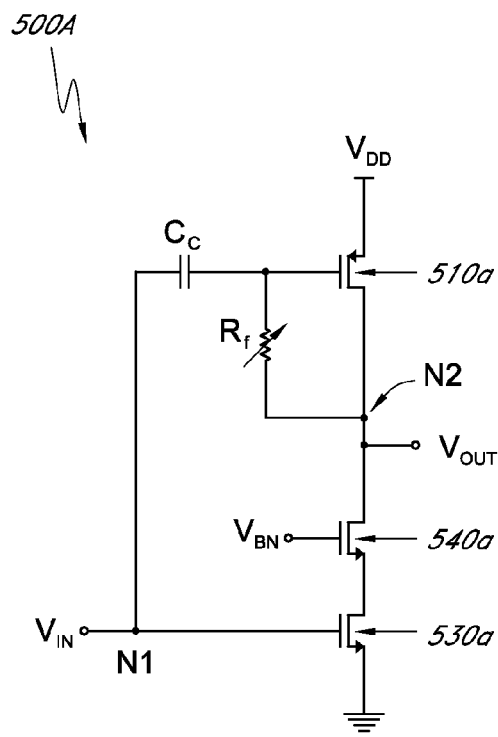
FIG. 5A is a circuit diagram of a low noise amplifier according to another embodiment.

Referring to FIG. 5A, another embodiment of a circuit for a low noise amplifier (for example, the low noise amplifier block 130 of FIG. 1) will be described below. The illustrated circuit 500A includes a first p-type transistor 510a, a first n-type transistor 530a, a second n-type transistor 540a, a variable feedback resistor $R_f$, a coupling capacitor Cc, a first node N1, and a second node N2. The circuit 500A does not include a second p-type transistor in contrast to the circuit 300 of FIG. 3. In the illustrated embodiment, each of the transistors 510a, 530a, 540a can be a MOSFET device. In the context of this document, a circuit (such as the circuit 500A) having a single p-type transistor, and a first n-type transistor cascoded with a second n-type transistor can be referred to as a "NMOS half-cascode circuit."

Although not shown, the circuit 500A can further include a bias circuit as described above with respect to the bias circuit 402 of FIG. 4. The circuit 500A can also include an output capacitor and an output resistor, as described above with respect to the output capacitor $C_O$ and the output resistor $R_O$, respectively, of FIG. 4.

The first p-type transistor 510a has a source electrically coupled to a first voltage source $V_{DD}$, a drain electrically coupled to the second node N2, and a gate electrically coupled to a first terminal of the coupling capacitor Cc. Details of the first voltage source $V_{DD}$ can be as described above in connection with FIG. 4.

The first n-type transistor 530a has a source electrically coupled to ground, a drain electrically coupled to the source of the second n-type transistor 540a, and a gate electrically coupled to the first node N1. The second n-type transistor 540a has a source electrically coupled to the drain of the first n-type transistor 530a, a drain electrically coupled to the second node N2, and a gate electrically coupled to a first bias voltage $V_{BN}$.

The coupling capacitor Cc has a first terminal electrically coupled to the gate of the first p-type transistor 510a, and a second terminal electrically coupled to the first node N1. The coupling capacitor Cc can have a capacitance between about 3 pF and about 4 pF.

The feedback resistor Rf has a first end electrically coupled to the first terminal of the coupling capacitor Cc, and a second end electrically coupled to the second node N2. The feedback resistor Rf can have a variable resistance ranging between about 0 ohms and about 1,000 ohms. The first node N1 is configured to receive an input signal $V_{IN}$, and the second node N2 is configured to provide an output signal $V_{OUT}$.

The first n-type transistor 530a and the first p-type transistor 530a are connected in a complementary configuration. During high frequency operation, the first p-type transistor 510a operates as if the source of the first p-type transistor 510a is connected to ground. The first p-type transistor 510a receives an input signal $V_{IN}$ through the coupling capacitor Cc, and amplifies it while having a feedback via the feedback resistor Rf. The feedback resistor Rf provides shunt feedback to stabilize the operating point and set the input impedance of the circuit 500A. The first n-type transistor 530a also receives the input signal $V_{IN}$ directly from the first node N1, and amplifies the input signal $V_{IN}$.

The first n-type transistor 530a, by being cascoded with the second n-type transistor 540a, has a reduced Miller effect, thereby reducing the input capacitance. Thus, the overall forward gain can be increased. Further, only three MOS devices are connected between the voltage supply $V_{DD}$ and ground, instead of four MOS devices in the conventional amplifier of FIG. 3. For example, with a FET device overdrive of about 0.2 V, the amplifier of FIG. 5A has a total overdrive of about 0.6 V for the three MOS devices. Given a voltage supply $V_{DD}$ of, for example, about 1.2 V, this leaves about 0.6 V available to avoid pushing the cascoded devices into their triode operating regions. Thus, a 0.3 Vp-p signal would be possible to operate with the amplifier, providing better noise performance with sufficient linearity than the amplifier 300 of FIG. 3.

Figure 5B:
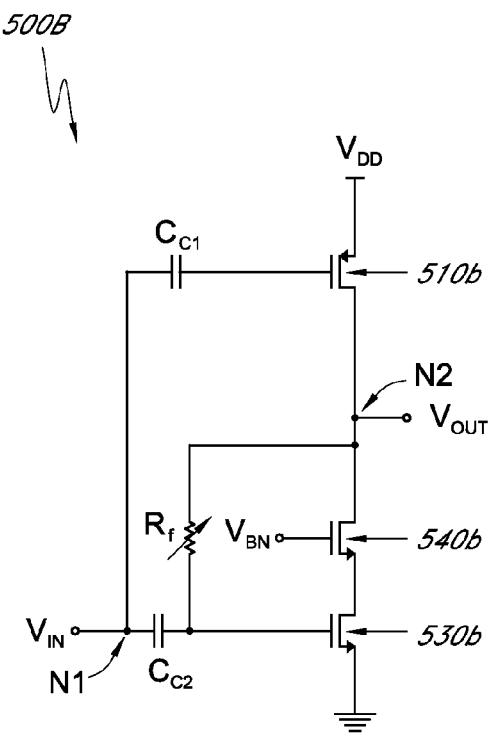
FIG. 5B is a circuit diagram of a low noise amplifier according to yet another embodiment.

Referring to FIG. 5B, yet another embodiment of a circuit for a low noise amplifier (for example, the low noise amplifier block 130 of FIG. 1) will be described below. The illustrated circuit 500B includes a first p-type transistor 510b, a first n-type transistor 530b, a second n-type transistor 540b, a variable feedback resistor Rf, a first coupling capacitor $C_{C1}$, a second coupling capacitor $C_{C2}$, a first node N1, and a second node N2. Similar to the circuit 500A of FIG. 5A, the circuit 500B does not include a second p-type transistor in contrast to the circuit 300 of FIG. 3. In the illustrated embodiment, each of the transistors 510b, 530b, 540b can be a MOSFET device. In the context of this document, the circuit 500B can also be referred to as a "NMOS half-cascode circuit."

Although not shown, the circuit 500B can further include a bias circuit to provide a bias voltage to the gate of the first n-type transistor 530b via the first node N1 and the second coupling capacitor $C_{C2}$, similar to the bias circuit 402 of FIG. 4. The circuit 500B can also include an output capacitor and an output resistor, as described above with respect to the output capacitor $C_O$ and the output resistor $R_O$, respectively, of FIG. 4.

The first p-type transistor 510b has a source electrically coupled to a first voltage source $V_{DD}$, a drain electrically coupled to the second node N2, and a gate electrically coupled to a first terminal of the first coupling capacitor $C_{C1}$. Details of the first voltage source $V_{DD}$ can be as described above in connection with FIG. 4.

The first n-type transistor 530b has a source electrically coupled to ground, a drain electrically coupled to the source of the second n-type transistor 540b, and a gate electrically coupled to the second coupling capacitor $C_{C2}$. The second n-type transistor 540b has a source electrically coupled to the drain of the first n-type transistor 530b, a drain electrically coupled to the second node N2, and a gate electrically coupled to a first bias voltage $V_{BN}$.

The first coupling capacitor $C_{C1}$ has a first terminal electrically coupled to the gate of the first p-type transistor 510b, and a second terminal electrically coupled to the first node N1. The first coupling capacitor $C_{C1}$ can have a capacitance between about 3 pF and about 4 pF. In another embodiment, the first coupling capacitor $C_{C1}$ can be omitted. In such an embodiment, the gate of the first p-type transistor can be electrically coupled to a bias voltage.

The second coupling capacitor $C_{C2}$ has a first terminal electrically coupled to the gate of the first n-type transistor 530b, and a second terminal electrically coupled to the first node N1. The second coupling capacitor $C_{C2}$ can have a capacitance between about 3 pF and about 4 pF.

The feedback resistor Rf has a first end electrically coupled to the gate of the first n-type transistor 530b, and a second end electrically coupled to the second node N2. The feedback resistor Rf can have a variable resistance ranging between about 0 ohms and about 1,000 ohms. The first node N1 is configured to receive an input signal $V_{IN}$, and the second node N2 is configured to provide an output signal $V_{OUT}$.

The first n-type transistor 530b and the first p-type transistor 510b are connected in a complementary configuration. During high frequency operation, the first p-type transistor 510b operates as if the source of the first p-type transistor 510b is connected to ground. The first p-type transistor 510b receives an input signal $V_{IN}$ through the first coupling capacitor $C_{C1}$, and amplifies it. The first n-type transistor 530b receives the input signal $V_{IN}$ through the second coupling capacitor $C_{C2}$, and amplifies it while having a feedback via the feedback resistor Rf. The feedback resistor Rf provides shunt feedback to stabilize the operating point and set the input impedance of the circuit 500B.

The first n-type transistor 530b, by being cascoded with the second n-type transistor 540b, has a reduced Miller effect, thereby reducing the input capacitance. Thus, the overall forward gain can be increased. Further, because only three MOS devices are connected between the voltage supply $V_{DD}$ and ground, instead of four MOS devices in the conventional amplifier of FIG. 3, the amplifier 500B of FIG. 5B provides better noise performance with sufficient linearity than the amplifier 300 of FIG. 3.

Figures 6A, 6B:
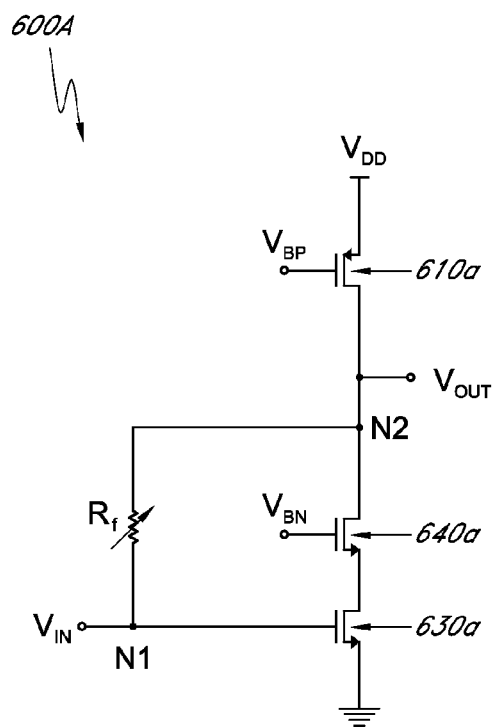
FIG. 6A is a circuit diagram of a low noise amplifier according to yet another embodiment.
FIG. 6B is a circuit diagram of a low noise amplifier according to yet another embodiment.

Referring to FIG. 6A, yet another embodiment of a circuit for a low noise amplifier (for example, the low noise amplifier block 130 of FIG. 1) will be described below. The illustrated circuit 600A includes a first p-type transistor 610a, a first n-type transistor 630a, a second n-type transistor 640a, a variable feedback resistor Rf, a first node N1, and a second node N2. Similar to the circuit 500A of FIG. 5A, the circuit 600A does not include a second p-type transistor in contrast to the circuit 300 of FIG. 3. In the illustrated embodiment, each of the transistors 610a, 630a, 640a can be a MOSFET device. In the context of this document, the circuit 600A can also be referred to as a "NMOS half-cascode circuit."

Although not shown, the circuit 600A can further include a bias circuit to provide a bias voltage to the gate of the first n-type transistor 630a, as described above with respect to the bias circuit 402 of FIG. 4. The circuit 600A can also include an output capacitor and an output resistor, as described above with respect to the output capacitor $C_O$ and the output resistor $R_O$, respectively, of FIG. 4.

The first p-type transistor 610a has a source electrically coupled to a first voltage source $V_{DD}$, a drain electrically coupled to the second node N2, and a gate electrically coupled to a first bias voltage $V_{BP}$. Details of the first voltage source $V_{DD}$ can be as described above in connection with FIG. 4.

The first n-type transistor 630a has a source electrically coupled to ground, a drain electrically coupled to the source of the second n-type transistor 640a, and a gate electrically coupled to the first node N1. The second n-type transistor 640a has a source electrically coupled to the drain of the first n-type transistor 630a, a drain electrically coupled to the second node N2, and a gate electrically coupled to a second bias voltage $V_{BN}$.

The feedback resistor Rf has a first end electrically coupled to the first node N1, and a second end electrically coupled to the second node N2. The feedback resistor Rf can have a variable resistance ranging between about 0 ohms and about 1,000 ohms. The first node N1 is configured to receive an input signal $V_{IN}$, and the second node N2 is configured to provide an output signal $V_{OUT}$.

During operation, the first p-type transistor 610a does not receive an input signal $V_{IN}$, in contrast to the first p-type transistor 510a of FIG. 5A. The first p-type transistor 610a operates to provide an optimized bias current for the first n-type transistor 630a. The first n-type transistor 630a, which is cascoded with the second n-type transistor 640a, receives the input signal $V_{IN}$, and amplifies it while having a feedback via the feedback resistor Rf. The feedback resistor Rf provides shunt feedback to stabilize the operating point and set the input impedance of the circuit 600A.

The first n-type transistor 630a, by being cascoded with the second n-type transistor 640a, has a reduced Miller effect, thereby reducing the input capacitance. Thus, the overall forward gain can be increased. Further, because only three MOS devices are connected between the voltage supply $V_{DD}$ and ground, instead of four MOS devices in the conventional amplifier 300 of FIG. 3, the amplifier 600A of FIG. 6A provides better noise performance with sufficient linearity than the amplifier 300 of FIG. 3.

Referring to FIG. 6B, yet another embodiment of a circuit for a low noise amplifier (for example, the low noise amplifier block 130 of FIG. 1) will be described below. The illustrated circuit 600B includes a first p-type transistor 610b, a second p-type transistor 620b, a first n-type transistor 630b, a variable feedback resistor Rf, a first node N1, and a second node N2. The circuit 600B does not include a second n-type transistor in contrast to the circuit 300 of FIG. 3. In the illustrated embodiment, each of the transistors 610b, 620b, 630b can be a MOSFET device. In the context of this document, the circuit 600B can also be referred to as a "PMOS half-cascode circuit."

Although not shown, the circuit 600B can further include a bias circuit to provide a bias voltage to the gate of the first p-type transistor 610b, similar to the bias circuit 402 of FIG. 4. The circuit 600B can also include an output capacitor and an output resistor, as described above with respect to the output capacitor $C_O$ and the output resistor $R_O$, respectively, of FIG. 4.

The first p-type transistor 610b has a source electrically coupled to a first voltage source $V_{DD}$, a drain electrically coupled to the source of the second p-type transistor 620b, and a gate electrically coupled to the first node N1. Details of the first voltage source $V_{DD}$ can be as described above in connection with FIG. 4.

The second p-type transistor 620b has a source electrically coupled to the drain of the first p-type transistor 610b, a drain electrically coupled to the second node N2, and a gate electrically coupled to a first bias voltage $V_{BP}$. The first n-type transistor 630b has a source electrically coupled to ground, a drain electrically coupled to the second node N2, and a gate electrically coupled to a second bias voltage $V_{BN}$.

The feedback resistor Rf has a first end electrically coupled to the first node N1, and a second end electrically coupled to the second node N2. The feedback resistor Rf can have a variable resistance ranging between about 0 ohms and about 1,000 ohms. The first node N1 is configured to receive an input signal $V_{IN}$, and the second node N2 is configured to provide an output signal $V_{OUT}$.

During operation, the first n-type transistor 630b does not receive an input signal $V_{IN}$, in contrast to the first n-type transistor 430 of FIG. 4. The first n-type transistor 630b operates to provide an optimized bias current for the first p-type transistor 610b. The first p-type transistor 610b, which is cascoded with the second p-type transistor 620b, receives the input signal $V_{IN}$, and amplifies it while having a feedback via the feedback resistor Rf. The feedback resistor Rf provides shunt feedback to stabilize the operating point and set the input impedance of the circuit 600B.

The first p-type transistor 610b, by being cascoded with the second p-type transistor 620b, has a reduced Miller effect, thereby reducing the input capacitance. Because a p-type transistor has a lower carrier mobility than an n-type transistor, the p-type transistor has a larger gate-to-drain capacitance than that of an n-type transistor for a given transconductance. Further, the first p-type transistor 610b, which is a PMOS device, has reduced output impedance compared to an NMOS device. Thus, by cascoding the p-type transistor 610b, the overall forward gain can be improved. Further, because only three MOS devices are connected between the voltage supply $V_{DD}$ and ground, instead of four MOS devices in the conventional amplifier of FIG. 3, the amplifier 600A of FIG. 6A provides better noise performance with sufficient linearity than the amplifier 300 of FIG. 3.

Figure 7:
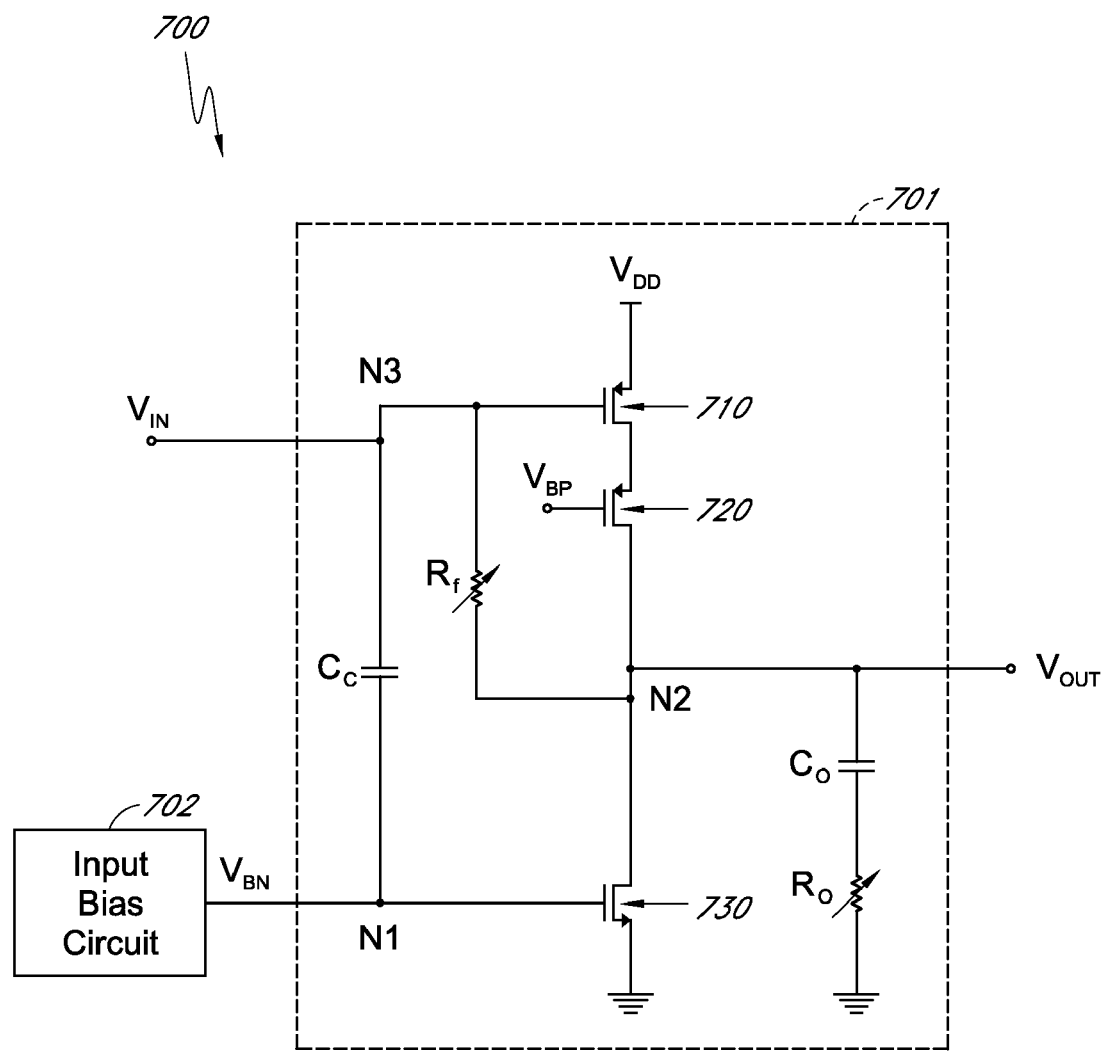
FIG. 7 is a circuit diagram of a low noise amplifier according to yet another embodiment.

Referring to FIG. 7, another embodiment of a low noise amplifier (for example, for use in the low noise amplifier block 130 of FIG. 1) will be described below. The illustrated low noise amplifier 700 includes an amplifier circuit 701 and an input bias circuit 702. The illustrated amplifier circuit 701 includes a first p-type transistor 710, a second p-type transistor 720, a first n-type transistor 730, a variable feedback resistor $R_f$, a coupling capacitor $C_c$, an output capacitor $C_O$, an output resistor $R_O$, a first node N1, a second node N2, and a third node N3. In certain embodiments, the output capacitor $C_O$ and/or the output resistor $R_O$ can be omitted.

The circuit 701 does not include a second n-type transistor in contrast to the circuit 300 of FIG. 3. In the illustrated embodiment, each of the transistors 710, 720, 730 can be a MOSFET device. In the context of this document, a circuit (such as the circuit 701) having a single n-type transistor, and a first p-type transistor cascoded with a second p-type transistor can be referred to as a "PMOS half-cascode circuit."

The first p-type transistor 710 has a source electrically coupled to a first voltage source $V_{DD}$, a drain electrically coupled to the source of the second p-type transistor 720, and a gate electrically coupled to a first terminal of the coupling capacitor Cc via the third node N3. The first voltage source $V_{DD}$ can have a voltage between about 1.1 V and about 1.3 V, for example, about 1.2 V.

The second p-type transistor 720 has a source electrically coupled to the drain of the first p-type transistor 710, a drain electrically coupled to the second node N2, and a gate electrically coupled to a first bias voltage $V_{BP}$. The first n-type transistor 730 has a source electrically coupled to ground, a drain electrically coupled to the second node N2, and a gate electrically coupled to the first node N1.

The coupling capacitor $C_c$ has a first terminal electrically coupled to the third node N3, and a second terminal electrically coupled to the first node N1. The coupling capacitor $C_c$ can have a capacitance between about 3 pF and about 4 pF. The position and connection of the coupling capacitor $C_c$ may provide improved performance at low frequencies.

The feedback resistor $R_f$ has a first end electrically coupled to the third node N3, and a second end electrically coupled to the second node N2. The feedback resistor $R_f$ can have a variable resistance ranging between about 0 ohms and about 1,000 ohms. The third node N3 is configured to receive an input signal $V_{IN}$, and the second node N2 is configured to provide an output signal $V_{OUT}$.

The output capacitor $C_O$ has a first terminal electrically coupled to the second node N2, and a second terminal electrically coupled to the output resistor $R_O$. The output capacitor $C_O$ can have a capacitance between about 3 pF and about 4 pF.

The output resistor $R_O$ has a first end electrically coupled to the second terminal of the output capacitor $C_O$, and a second end electrically coupled to ground. The output resistor $R_O$ can have a variable resistance ranging between about 0 ohms and about 1,000 ohms. In one embodiment, the resistance of the output capacitor $C_O$ can be changed in concert with the resistance of the feedback resistor $R_f$ to vary the gain of the amplifier 700.

The input bias circuit 702 serves to bias the gate of the first n-type transistor 730 via the first node N1 by providing a bias voltage $V_{BN}$. A skilled artisan will appreciate that various configurations of bias circuits can be used for the input bias circuit 702. In one embodiment, the input bias circuit 702 can include a current minor circuit and one or more resistors coupled between the output of the current mirror circuit and the first node N1. In other embodiments, the input bias circuit 702 may be controlled to provide different bias voltages, depending on the needs. Other details of the amplifier circuit 701 and its operation can be as described above in connection with the amplifier circuit 401 of FIG. 4.

Figure 8:
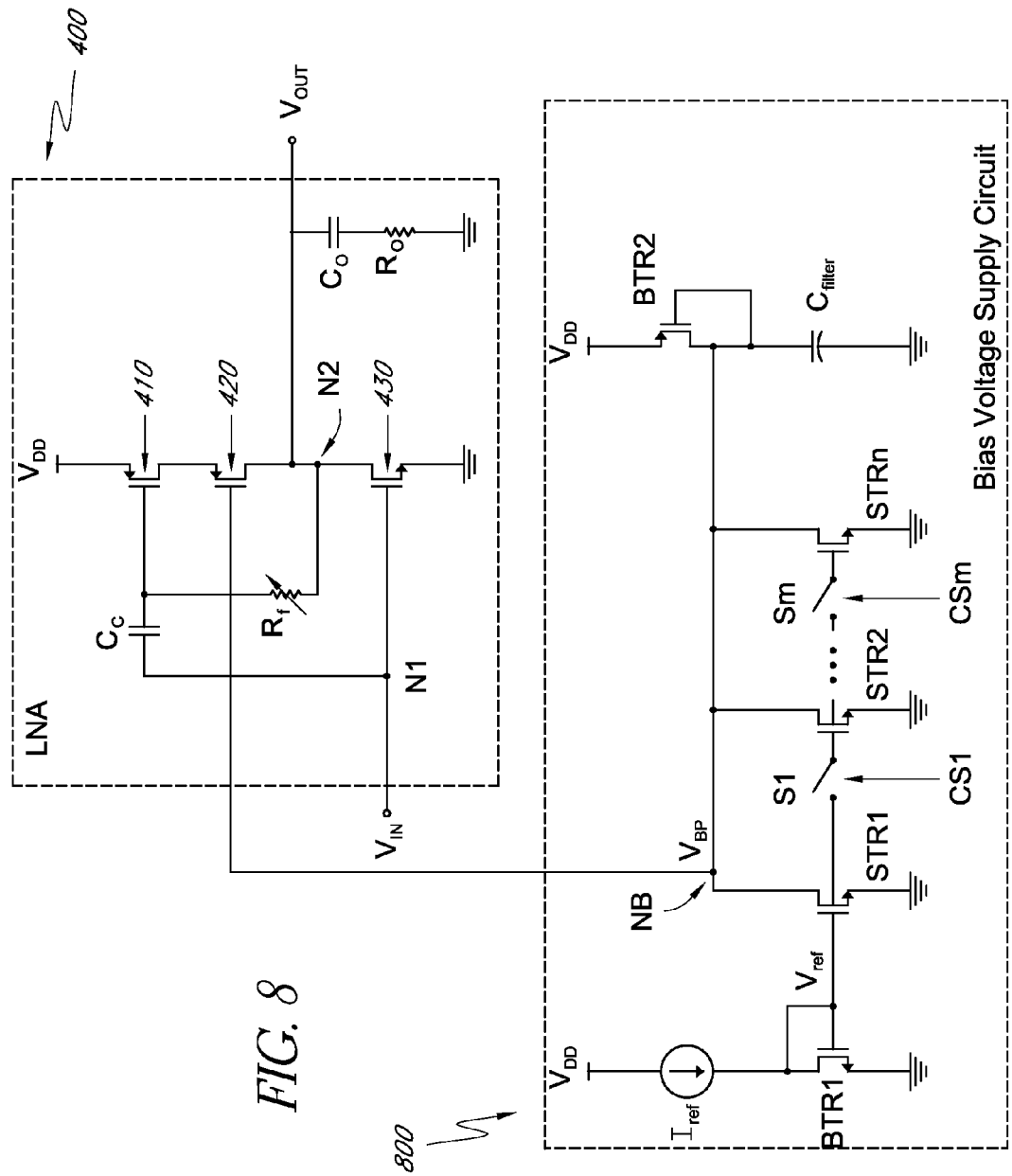
FIG. 8 is a circuit diagram of a bias circuit for adjusting a bias voltage of a low noise amplifier according to one embodiment.

Referring to FIG. 8, one embodiment of a bias voltage supply circuit for a half-cascode circuit for a low noise amplifier will be described below. For example, the bias voltage supply circuit can be part of the low noise amplifier block 130 of FIG. 1. The illustrated circuit 800 can be used to provide a bias voltage to any one of the circuits 401, 500A, 500B, 600A, 600B, and 701 of FIGS. 4-7. For example, the bias voltage can be provided to the gate of one of the second p-type transistors 420, 720 of FIGS. 4 and 7, and the second n-type transistors 540a, 540b of FIGS. 5A and 5B. In each of the embodiments shown in FIGS. 6A and 6B, the gates of the second p-type transistor 620b and the second n-type transistor 640a can be provided with separate bias voltage supply circuits outputting different bias voltages. One of ordinary skill in the art will readily determine that other bias circuits can be used for providing a bias voltage to the circuits 400, 500A, 500B, 600A, 600B, and 700 of FIGS. 4-7.

In the illustrated embodiment, the bias circuit 800 is shown to provide a bias voltage to the amplifier circuit 401 of FIG. 4 as an example. The bias circuit 800 includes a current source $I_{REF}$, a first bias transistor BTR1, a second bias transistor BTR2, first to n-th selection transistors STR1, STR2, ..., STRn (where n is an integer greater than 1), first to m-th switches (where m=n−1), a filter capacitor $C_{filter}$, a bias voltage output node NB. In the illustrated embodiment, the transistors BTR1, STR1-STRn are n-type MOSFETs while the second bias transistor BTR2 is a p-type MOSFET. In other embodiments, the circuit 800 can be modified to have the transistors BTR1, BTR2, STR1-STRn replaced with MOSFETs of an opposite polarity, and/or other types of FET devices.

The current source $I_{REF}$ is electrically coupled between the first voltage source $V_{DD}$ and the drain of the first bias transistor BTR1. The current source $I_{REF}$ is configured to supply a constant current to the first bias transistor BTR1.

The first bias transistor BTR1 is a diode-connected transistor, and has a source electrically coupled to ground, a drain electrically coupled to the current source $I_{REF}$, and a gate electrically coupled to the drain thereof. The first bias transistor BTR1, by having its drain and gate coupled to each other, provides a constant voltage to the selection transistors STR1, STR2, ..., STRn.

Each of the selection transistors STR1, STR2, ..., STRn includes a source electrically coupled to ground, and a drain electrically coupled to the bias voltage output node NB. The first selection transistor STR1 also has a gate electrically coupled to the gate of the first bias transistor BTR1. The second selection transistor STR2 also has a gate that can be electrically coupled to the gate of the first bias transistor BTR1 via the first switch $S_1$. The third selection transistor STR3 (not shown) also has a gate that can be electrically coupled to the gate of the first bias transistor BTR1 via the second switch $S_2$ (not shown). In this manner, the n-th selection transistor STRn also has a gate that can be electrically coupled to the gate of the first bias transistor BTR1 via the m-th switch $S_m$. The number of selection transistors STR1, STR2, STRn can vary widely, depending on the design of the circuit 800 and degree of controlling a bias voltage provided to the low noise amplifier circuit 401.

The switches $S_1$-$S_m$ are configured to receive control signals $CS_1$-$CS_m$, respectively, from a controller. The control signals $CS_1$-$CS_m$ can be either analog or digital. When the switches $S_1$-$S_m$ receive the control signals $CS_1$-$CS_m$, they are switched on to provide the constant voltage from the gate of the first bias transistor BTR1 to the gates of the selection transistors, thereby turning on the selection transistors.

The first switch $S_1$ is electrically coupled between the gate of the first bias transistor BTR1 and the gate of the second selection transistor STR2. The first switch $S_1$, when turned on, provides the constant voltage from the gate of the first bias transistor BTR1 to the gate of the second selection transistor STR2, thereby turning on the second selection transistor STR2. Similarly, each of the other switches (such as the m-th switch $S_m$) is electrically coupled between the gate of the first bias transistor BTR1 and the gate of a respective one of the selection transistors (for example, the n-th selection transistor STRn). Each of the other switches, when turned on, provides the constant voltage from the gate of the first bias transistor BTR1 to the gate of the respective one of the selection transistors, thereby turning on the selection transistor.

The second bias transistor BTR2 is a diode-connected transistor. The second bias transistor BTR2 has a source electrically coupled to the first voltage source $V_{DD}$, a drain electrically coupled to the bias voltage output node NB, and a gate electrically coupled to the drain thereof. In an embodiment where the bias voltage supply circuit 800 is used for providing a bias voltage $V_{BP}$ to the first p-type transistor 610a of the circuit 600A of FIG. 6A, the first p-type transistor 610a mirrors the second bias transistor BTR2.

The filter capacitor $C_{filter}$ has a first terminal electrically coupled to the bias voltage output node NB and a second terminal electrically coupled to ground. The filter capacitor $C_{filter}$ serves to provide a stable bias voltage to the bias voltage output node NB in conjunction with the second bias transistor BTR2. In another embodiment, a filter capacitor can be electrically coupled between the bias voltage output node NB and the first voltage source $V_{DD}$, instead of having the second bias transistor BTR2 and the filter capacitor $C_{filter}$ of FIG. 8.

In one embodiment, the controller that provides the control signals $CS_1$-$CS_m$ to the switches $S_1$-$S_m$ can be the digital processor 190 of FIG. 1. In such an embodiment, during operation, the digital processor 190 can determine a bias voltage needed for the operation of the half cascode circuit of the low noise amplifier block 130. After processing a signal that has passed through the low noise amplifier block 130, the digital processor 190 can generate the control signals $CS_1$-$CS_m$. The digital processor 190 can provide the bias circuit 800 (in the low noise amplifier block 130) with the control signals $CS_1$-$CS_m$ as a feedback signal, thereby adjusting the bias voltage(s) provided to the low noise amplifier circuit (for example, the amplifier circuit 401).

The bias circuit 800 can generate a current which is converted into a cascode bias voltage by the second bias transistor BTR2 and the filter capacitor $C_{filter}$. The magnitude of the current can be varied by selectively turning on the selection transistors STR1, STR2, . . . , STRn using the control signals $CS_1$-$CS_m$. The DAC can allow the half cascode amplifier circuit 401 to be set to have the maximum signal headroom for a range of power supply voltages, independently of the gain-setting path of the circuit 400.

Thus, the embodiments described above allow a low noise amplifier circuit (for example, the half cascode circuits 401, 500A, 500B, 600A, and 600B) to adjust its parameters (such as a gain and impedance) by changing its bias voltage. Further, the shunt feedback resistor Rf can also be adjusted in response to a control signal. By adjusting the parameters, the low noise amplifier circuit can provide an increased high-frequency gain and linearity while having improved high-frequency system noise figure than would be possible using traditional techniques.

The half-cascode structures according to the above embodiments, coupled with some gain from the impedance step in the input matching network, allow the low noise amplifier to meet the gain and bandwidth requirements for certain applications for wireless communication. Further, as described in connection with FIG. 8, a cascode structure in the signal path across a variable supply voltage can be optimized to provide a desired performance by being controlled by a processor.

SIMULATED EXAMPLES

In Example 1, a low noise amplifier was implemented without a cascode structure. In Example 2, a low noise amplifier was implemented with the NMOS half cascode structure of FIG. 5A. In Example 3, a low noise amplifier was implemented with the PMOS half cascode structure of FIG. 4. In Example 4, a low noise amplifier was implemented with the full cascode structure of FIG. 3.

The low noise amplifiers of Examples 1-4 demonstrated that they have a parasitic capacitance ($C_{gd}$) on its PMOS transistor of 56.2 fF and a parasitic capacitance ($C_O$) on its NMOS transistor of 34.1 fF. Since the gain from input to output is approximately 10, the Miller effect would multiply the effective input capacitance of the PMOS transistor by a factor of 11 to 0.62 pF and the NMOS transistor to 0.38 pF to a total of approximately 1 pF. Since cascoding reduced the gain across the common-source device to approximately unity, cascoding the NMOS transistor would reduce its contribution to 2 times $C_{gd}$, or 68.2 fF. Cascoding the PMOS reduces its contribution to about 112.4 fF. A summary of the total effective input capacitance of Examples 1-4 is shown in Table 1.

TABLE 1

| | NMOS parasitic capacitance [fF] | NMOS effective capacitance [fF] | PMOS parasitic capacitance [fF] | PMOS effective capacitance [fF] | Total capacitance [fF] | Percent Reduction |
|---|---|---|---|---|---|---|
| Example 1 (No cascode) | 34.1 | 375.1 | 56.2 | 618.2 | 993.3 | N/A |
| Example 2 (NMOS Cascoded) | 34.1 | 68.2 | 56.2 | 618.2 | 686.4 | 30.9% |
| Example 3 (PMOS Cascoded) | 34.1 | 375.1 | 56.2 | 112.4 | 487.5 | 50.9% |
| Example 4 (Both Cascoded) | 34.1 | 68.2 | 56.2 | 112.4 | 180.6 | 81.8% |

While cascoding the entire signal path would give the best performance, it is not always practical in deep submicron CMOS technology due to headroom constraints. Cascoding the PMOS transistor yielded much lower total effective input capacitance than cascoding the NMOS transistor.

APPLICATIONS

The embodiments described above can be used for a transceiver or receiver for wideband radio front ends in deep submicron CMOS technology, particularly for a low noise amplifier. However, the principles and advantages of the embodiments can apply to any similar systems or devices where the self-gain of the available FETs is too small to achieve the required gain, and the power supply is too low to allow a traditional implementation of a cascode amplifier.

Thus, a skilled artisan will appreciate that the configurations and principles of the embodiments can be adapted for any other transceivers or receivers. The circuits employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include circuits of optical networks or other communication networks, and disk driver circuits. The consumer electronic products can include, but are not limited to, a mobile phone, cellular base stations, a telephone, a television, a computer monitor, a computer, a hand-held computer, a netbook, a tablet computer, a digital book, a personal digital assistant (PDA), a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   an amplifier circuit comprising:
      an input node;
      an output node;
      a first supply voltage node configured to be electrically coupled to a first voltage source;
      a second supply voltage node configured to be electrically coupled to a second voltage source;
      a first transistor of a first polarity, the first transistor having a gate electrically coupled to the input node;
      a second transistor of a second polarity complementary to the first polarity, the second transistor having a gate electrically coupled to the input node, wherein the first and second transistors are connected in series between the first and second supply voltage nodes via the output node; and
      a third transistor cascoded with one of the first transistor or the second transistor, wherein the third transistor is electrically coupled and inserted between the one of the first transistor or the second transistor and the output node;
   wherein the amplifier circuit does not include a transistor cascoded with the other of the first transistor or the second transistor.

2. The apparatus of claim 1, wherein the first voltage source has a voltage between about 1.1 V and about 1.3 V, and wherein the second voltage source has a voltage of about 0 V.

3. The apparatus of claim 1, wherein one of the first and second transistors are configured to receive an input signal via the input node, and wherein the amplifier circuit is configured to provide an output signal via the output node.

4. The apparatus of claim 1, wherein the first transistor is a PMOS transistor having a gate electrically coupled to the input node and a source electrically coupled to the first supply voltage node, wherein the second transistor is an NMOS transistor having a source electrically coupled to the second supply voltage node, wherein the third transistor is a PMOS transistor that is cascoded with the first transistor, wherein the first supply voltage node is intended to be greater in voltage than the second supply voltage node.

5. The apparatus of claim 4, wherein the first transistor is electrically coupled between the first supply voltage node and the third transistor, and wherein the second transistor is electrically coupled between the second supply voltage node and the output node.

6. The apparatus of claim 1, wherein the first transistor is a PMOS transistor having a source electrically coupled to the first supply voltage node, wherein the second transistor is an NMOS transistor having a gate electrically coupled to the input node and a source electrically coupled to the second supply voltage node, wherein the third transistor is an NMOS transistor that is cascoded with the second transistor, wherein the first supply voltage node is intended to be greater in voltage than the second supply voltage node.

7. The apparatus of claim 6, wherein the first transistor is electrically coupled between the first supply voltage node and the output node, and wherein the second transistor is electrically coupled between the second supply voltage node and the third transistor.

8. The apparatus of claim 7, wherein the amplifier circuit further comprises:
   a resistor electrically coupled between the gate of the first transistor and the output node; and
   a capacitor electrically coupled between the gate of the first transistor and the input node.

9. The apparatus of claim 7, wherein the amplifier circuit further comprises:
   a resistor electrically coupled between the gate of the second transistor and the output node; and
   a first capacitor electrically coupled between the gate of the second transistor and the input node.

10. The apparatus of claim 9, wherein the amplifier circuit further comprises a second capacitor electrically coupled between the gate of the first transistor and the input node.

11. The apparatus of claim 7, wherein the amplifier circuit further comprises a resistor electrically coupled between the gate of the second transistor and the output node, and wherein the first transistor has a gate configured to receive a bias voltage.

12. The apparatus of claim 1, wherein the third transistor has a gate configured to receive a bias voltage.

13. The apparatus of claim 12, further comprising a bias voltage supply circuit configured to provide the bias voltage to the amplifier circuit, wherein the bias voltage supply circuit is configured to receive a control signal to change the bias voltage.

14. The apparatus of claim 13, wherein the bias voltage supply circuit comprises a plurality of selection transistors coupled in parallel between a bias voltage output node and ground, and wherein the selection transistors are configured to be selectively turned on in response to the control signal to change the bias voltage.

15. The apparatus of claim 1, wherein the amplifier circuit further comprises a capacitor electrically coupled between the input node and the gate of the second transistor.

16. The apparatus of claim 1, further comprising a resistor electrically coupled between the gate of the first transistor and the output node.

17. An apparatus comprising:
an amplifier circuit comprising:
an input node;
an output node;
a first supply voltage node configured to be electrically coupled to a first voltage source;
a second supply voltage node configured to be electrically coupled to a second voltage source, wherein the first supply voltage node is intended to be greater in voltage than the second supply voltage node;
a first PMOS transistor having a gate electrically coupled to the input node and a source electrically coupled to the first supply voltage node;
an NMOS transistor having a source electrically coupled to the second supply voltage node, wherein the first PMOS transistor and the NMOS transistor are connected in series between the first and second supply voltage nodes via the output node, and wherein the NMOS transistor is electrically coupled between the second supply voltage node and the output node;
a second PMOS transistor cascoded with the first PMOS transistor, wherein the second PMOS transistor is electrically coupled and inserted between the first PMOS transistor and the output node, and wherein first PMOS transistor is electrically coupled between the first supply voltage node and the second PMOS transistor; and
a resistor electrically coupled between the gate of the first PMOS transistor and the output node;
wherein the amplifier circuit does not include a transistor cascoded with the NMOS transistor.

18. The apparatus of claim 17, wherein the amplifier circuit further comprises a capacitor electrically coupled between the gate of the first transistor and the input node, and wherein the second transistor has a gate electrically coupled to the input node.

19. The apparatus of claim 17, wherein the amplifier circuit further comprises a capacitor electrically coupled between the gate of the first PMOS transistor and the gate of the NMOS transistor, and wherein the gate of the first PMOS transistor is electrically coupled to the input node.

20. The apparatus of claim 17, wherein the NMOS transistor has a gate configured to receive a bias voltage.

21. An electronic device comprising:
a low noise amplifier circuit configured to receive a signal at an input node and to output an amplified signal at an output node, wherein the low noise amplifier circuit comprises:
a first transistor of a first polarity, the first transistor having a gate electrically coupled to the input node;
a second transistor of a second polarity complementary to the first polarity, the second transistor having a gate electrically coupled to the input node, wherein the first and second transistors are connected in series between first and second supply voltage nodes via the output node; and
a third transistor cascoded with one of the first transistor or the second transistor, wherein the third transistor is electrically coupled between the one of the first transistor or the second transistor and the output node,
wherein the low noise amplifier circuit does not include a transistor cascoded with the other of the first transistor or the second transistor.

22. The system of claim 21, wherein the first voltage source has a voltage between about 1.1 V and about 1.3 V, and wherein the second voltage source has a voltage of about 0 V.

23. The system of claim 21, wherein one or more of the first and second transistors are configured to receive the signal via the input node.

24. The system of claim 23, wherein the first transistor is a PMOS transistor having a gate electrically coupled to the input node and a source electrically coupled to the first supply voltage node, wherein the second transistor is an NMOS transistor having a source electrically coupled to the second supply voltage node, wherein the third transistor is a PMOS transistor that is cascoded with the first transistor, wherein the first supply voltage node is intended to be greater in voltage than the second supply voltage node.

25. The system of claim 23, wherein the first transistor is a PMOS transistor having a source electrically coupled to the first supply voltage node, wherein the second transistor is an NMOS transistor having a gate electrically coupled to the input node and a source electrically coupled to the second supply voltage node, wherein the third transistor is an NMOS transistor that is cascoded with the second transistor, wherein the first supply voltage node is intended to be greater in voltage than the second supply voltage node.

26. The system of claim 21, further comprising a bias voltage supply circuit configured to provide a bias voltage to the amplifier circuit, wherein the bias voltage supply circuit is configured to program the level of the bias voltage based at least partly on a control signal.

27. The system of claim 26, further comprising a processor downstream of the low noise amplifier circuit in a signal path, wherein the processor is configured to provide the control signal to the bias voltage supply circuit.

28. The system of claim 21, further comprising an input impedance matching network upstream of the low noise amplifier circuit in the signal path.

29. The electronic device of claim 21, wherein the low noise amplifier circuit further comprises a capacitor electrically coupled between the input node and the gate of the second transistor.

30. A method of amplifying a signal, the method comprising:
- providing the signal to a gate of a first transistor of a first polarity and to a gate of a second transistor of a second polarity complementary to the first polarity, wherein the first and second transistors are connected in series between first and second supply voltages, wherein one of the first transistor or the second transistor is cascoded with a third transistor electrically coupled between the first and second transistors, wherein the other of the first transistor or the second transistor is not cascoded with a transistor; and
- outputting an amplified signal via an output node between the third transistor and the other of the first transistor or the second transistor.

31. The method of claim 30, wherein the first supply voltage is a voltage between about 1.1 V and about 1.3 V, and wherein the second supply voltage is about 0 V.

32. The method of claim 30, wherein the first transistor is a PMOS transistor, wherein the second transistor is an NMOS transistor, wherein the third transistor is a PMOS transistor that is cascoded with the first transistor.

33. The method of claim 30, wherein the first transistor is a PMOS transistor, wherein the second transistor is an NMOS transistor, wherein the third transistor is an NMOS transistor that is cascoded with the second transistor, and wherein providing the signal comprises providing the signal to one or more of the gates of the first and second transistors.

34. The method of claim 30, further comprising a capacitor electrically coupled between the input node and the gate of the second transistor.

35. A method of amplifying a signal, the method comprising:
- providing a signal to one or more of a first transistor of a first polarity, and a second transistor of a second polarity complementary to the first polarity, wherein the first and second transistors are connected in series between first and second supply voltages, wherein one of the first transistor or the second transistor is cascoded with a third transistor electrically coupled between the first and second transistors, wherein the other of the first transistor or the second transistor is not cascoded with a transistor;
- outputting an amplified signal via an output node between the third transistor and the other of the first transistor and the second transistor; and
- programming the level of a bias voltage provided to the gate of the third transistor, based at least partly on the amplified signal.

* * * * *

UNITED STATES PATENT AND TRADEMARK OFFICE
CERTIFICATE OF CORRECTION

PATENT NO.         : 8,120,428 B2                              Page 1 of 1
APPLICATION NO.    : 12/782237
DATED              : February 21, 2012
INVENTOR(S)        : Antonio Montalvo et al.

It is certified that error appears in the above-identified patent and that said Letters Patent is hereby corrected as shown below:

At column 16, line 38 (Approx), please change "$(C_O)$" to --$(C_{gd})$--.

At column 18, line 24, in Claim 3, after "one" insert --or more--.

Signed and Sealed this
Fourth Day of September, 2012

David J. Kappos
*Director of the United States Patent and Trademark Office*